US012745667B2

(12) United States Patent
Takizawa et al.

(10) Patent No.: US 12,745,667 B2
(45) Date of Patent: Sep. 22, 2026

(54) ELECTRONIC CIRCUIT PACKAGE, ITS MANUFACTURING METHOD, AND ELECTRONIC DEVICE HAVING ELECTRONIC CIRCUIT PACKAGE

(71) Applicant: TDK Corporation, Tokyo (JP)

(72) Inventors: Shuichi Takizawa, Tokyo (JP); Hiromu Harada, Tokyo (JP); Atsushi Yoshino, Tokyo (JP); Yuki Okino, Tokyo (JP)

(73) Assignee: TDK Corporation, Tokyo (JP)

( * ) Notice: Subject to any disclaimer, the term of this patent is extended or adjusted under 35 U.S.C. 154(b) by 681 days.

(21) Appl. No.: 18/295,377

(22) Filed: Apr. 4, 2023

(65) Prior Publication Data

US 2023/0317540 A1 Oct. 5, 2023

Related U.S. Application Data

(60) Provisional application No. 63/327,159, filed on Apr. 4, 2022.

(51) Int. Cl.
*H10W 74/47* (2026.01)
*H10W 74/01* (2026.01)
*H10W 74/10* (2026.01)
*H10W 90/00* (2026.01)

(52) U.S. Cl.
CPC ....... *H10W 74/121* (2026.01); *H10W 74/014* (2026.01); *H10W 74/019* (2026.01); *H10W 74/114* (2026.01); *H10W 74/47* (2026.01); *H10W 90/00* (2026.01)

(58) Field of Classification Search
None
See application file for complete search history.

(56) References Cited

U.S. PATENT DOCUMENTS

2013/0320572 A1* 12/2013 Chang .................. H01L 21/565 257/E23.116
2018/0108618 A1* 4/2018 Yamamoto ........ H01L 21/32051
2019/0157176 A1* 5/2019 Bonnici ................ H01L 21/565
2020/0066613 A1 2/2020 Lee et al.
2020/0194380 A1* 6/2020 Kang .................... H01L 23/295
2023/0282601 A1* 9/2023 Uezato .................... H01L 24/30 257/668

FOREIGN PATENT DOCUMENTS

JP 2020-035993 A 3/2020

OTHER PUBLICATIONS

Manufacturing. Open Learning. (n.d.). https://www.open.edu/openlearn/science-maths-technology/design-innovation/manufacturing/content-section-9 (Year: 2025).*

* cited by examiner

*Primary Examiner* — Jay C Chang
(74) *Attorney, Agent, or Firm* — Rimon P.C.

(57) ABSTRACT

An electronic circuit package disclosed in the present disclosure includes: a package board having an upper surface, a bottom surface positioned on a side opposite to the upper surface, and a side surface connecting the upper and bottom surfaces; an electronic component mounted on the upper surface of the package board; a first protective layer covering the upper surface of the package board so as to embed therein the electronic component; and a second protective layer covering the side surface of the package board. The first and second protective layers contact each other.

7 Claims, 16 Drawing Sheets

110
122
121
111
112
140
300
302
301
303

300
302
301
110
220
304
303

113
111

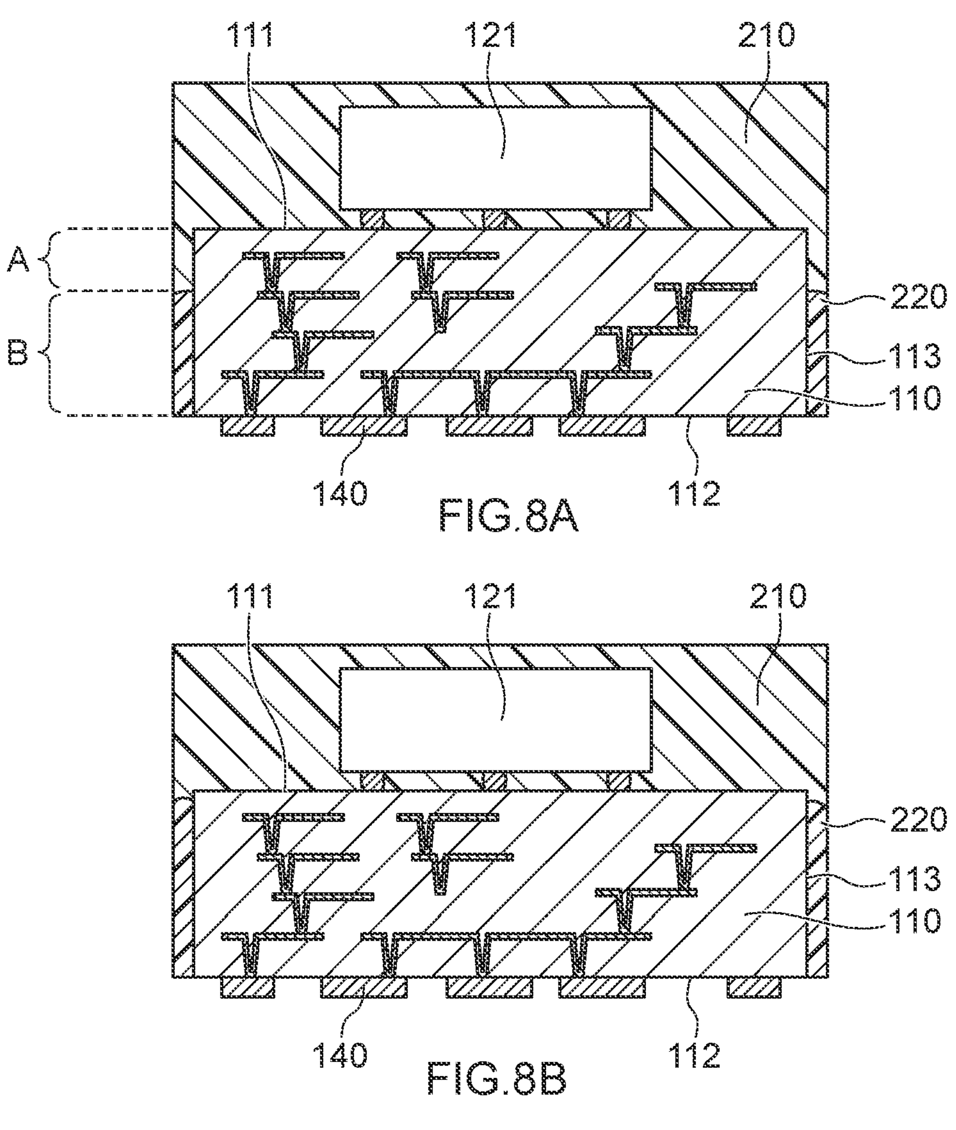
FIG.8A
FIG.8B
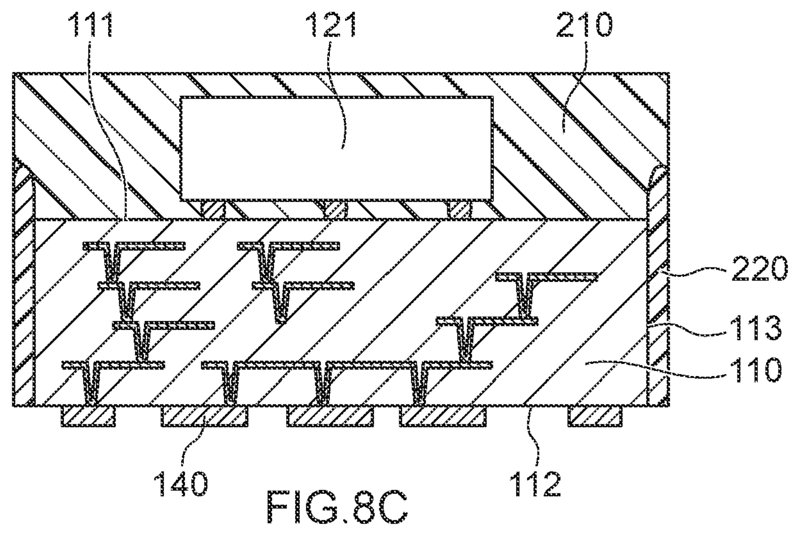
FIG.8C

| SAMPLE | Shape of Protective Layer 220 | Volume of Protective Layer 220 | Nondestructive Inspection | | Characteristic Inspection | Evaluation Result |
|---|---|---|---|---|---|---|
| | | | Before Moisture Absorption Reflow Test | After Moisture Absorption Reflow Test | | |
| A1 | FIG.4A | Small Amount | N=1NG/20pcs | N=3NG/19pcs | N=0NG/19pcs | ○ |
| A2 | FIG.4A | Middle Amount | N=1NG/20pcs | N=1NG/19pcs | N=0NG/19pcs | ○ |
| A3 | FIG.5A | Middle Amount | N=0NG/20pcs | N=0NG/20pcs | N=0NG/20pcs | ◎ |
| A4 | FIG.5A | Large Amount | N=0NG/20pcs | N=0NG/20pcs | N=0NG/20pcs | ◎ |
| A5 | FIG.6 | Middle Amount | N=0NG/20pcs | N=0NG/19pcs | N=0NG/19pcs | ◎ |
| A6 | FIG.7 | Large Amount | N=2NG/20pcs | N=1NG/18pcs | N=0NG/18pcs | ○ |
| B | FIG.5A | Middle Amount | N=1NG/20pcs | N=4NG/19pcs | N=0NG/19pcs | ○ |
| C | FIG.5A | Middle Amount | N=3NG/20pcs | N=4NG/17pcs | N=0NG/17pcs | ○ |
| D | — | — | N=3NG/20pcs | N=5NG/17pcs | N=2NG/17pcs | × |

FIG.14

ELECTRONIC CIRCUIT PACKAGE, ITS MANUFACTURING METHOD, AND ELECTRONIC DEVICE HAVING ELECTRONIC CIRCUIT PACKAGE

BACKGROUND OF THE INVENTION

Field of the Invention

The present disclosure relates to an electronic circuit package and its manufacturing method and, more particularly, to an electronic circuit package having a structure in which an electronic component mounted on the upper surface of the package is molded with a protective layer and its manufacturing method. The present disclosure also relates to an electronic device having such an electronic circuit package.

Description of Related Art

An electronic circuit package having a structure in which an electronic component mounted on the upper surface of the package is molded with a protective layer is sometimes mounted on another circuit board such as a motherboard. However, when an electronic circuit package is mounted on a motherboard, there may occur a connection failure in an electronic component mounted on the electronic circuit package. Specifically, when moisture absorbed by a package board is steam-exploded at the time of reflow for soldering the electronic circuit package and motherboard, cracks occur in each member or peeling occurs at the interface between members. Such cracks or peeling is one of the causes of the connection failure.

The interface between members constituting the electronic circuit package often has a structure in which members made of different kinds of materials are stuck to each other. For example, a material used for a capacitor or an inductor is often ceramic, a package board serving as a support or a sealing material serving as a protective layer is often a resin mixture, and a member for mechanically and electrically connecting a package board and an electronic component is often metal such as solder. Thus, when a temperature change occurs in the electronic circuit package, a shearing stress is accumulated in each interface due to a linear expansion difference or an elastic modulus difference to eventually cause interfacial peeling or cracks, which are one of the causes of the connection failure of electronic components.

Such a connection failure can generally be prevented in a design stage of an electronic circuit package. However, although the failure can be prevented in an electronic circuit package alone, stress may be applied from a motherboard at secondary or tertiary mounting which is performed on customer side, or a failure may occur in an electronic circuit package during a casing test assuming end user's use. A manufacturing process for an electronic device including an electronic circuit package includes a process subjected to many types of heat loads or stress loads, and thus, development of an electronic circuit package capable of sufficiently enduring a process load is desired.

SUMMARY

It is therefore an object of the present disclosure to provide an electronic circuit package capable of sufficiently enduring a process load.

An electronic circuit package according to an embodiment of the present disclosure includes: a package board having an upper surface, a bottom surface positioned on a side opposite to the upper surface, and a side surface connecting the upper and bottom surfaces; an electronic component mounted on the upper surface of the package board; a first protective layer covering the upper surface of the package board so as to embed therein the electronic component; and a second protective layer covering the side surface of the package board. The first and second protective layers contact each other.

BRIEF DESCRIPTION OF THE DRAWINGS

FIGS. 8A to 8C are schematic cross-sectional views each explaining the height position of the upper end of the protective layer;

FIG. 14 is a table showing the result of Example.

DETAILED DESCRIPTION OF THE EMBODIMENTS

Hereinafter, an embodiment of the technology according to the present disclosure will be described in detail with reference to the accompanying drawings.

Figure 1:
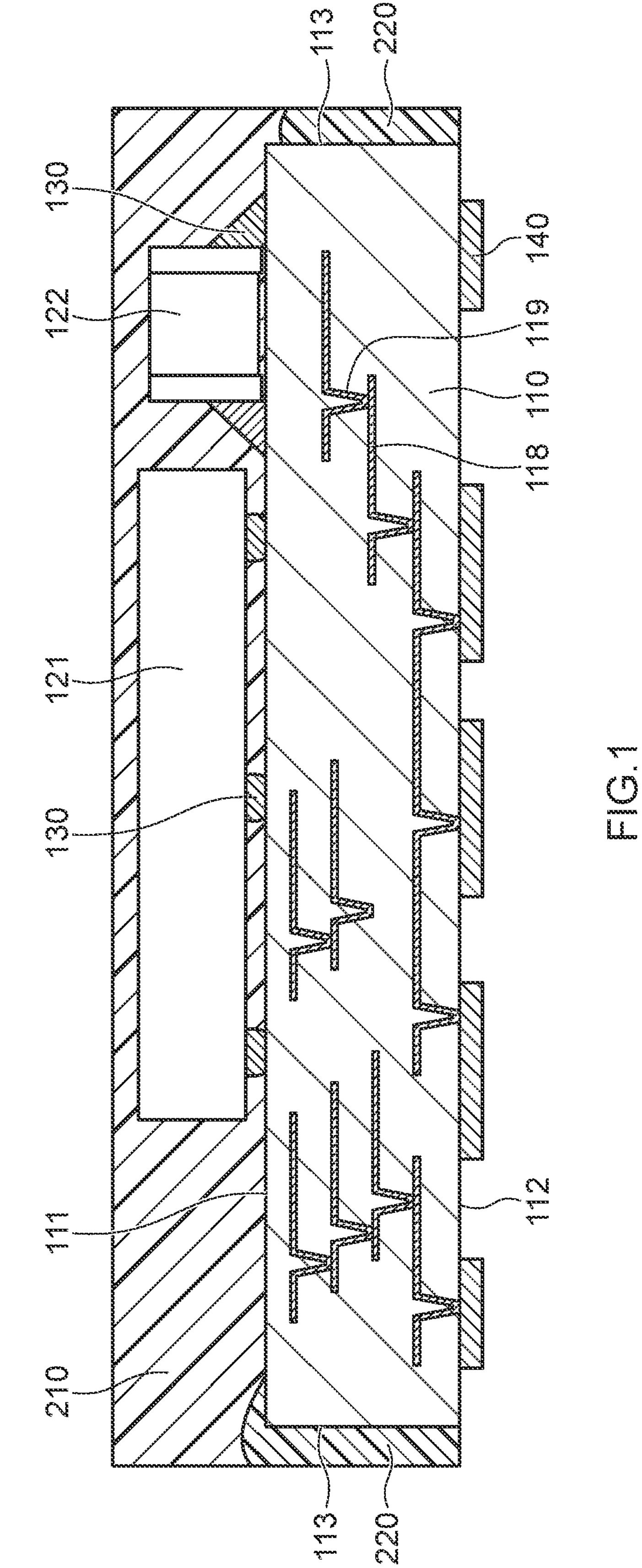
FIG. 1 is a schematic cross-sectional view for explaining the structure of an electronic circuit package according to an embodiment of the present disclosure.

FIG. 1 is a schematic cross-sectional view for explaining the structure of an electronic circuit package 100 according to an embodiment of the present disclosure.

As illustrated in FIG. 1, the electronic circuit package 100 according to the present embodiment includes a package board 110 having a multilayer wiring structure and protective layers 210 and 220 covering the package board 110. The package board 110 is made of a ceramic-based material, a polymer-based material, or a composite material thereof. Alternatively, the package board 110 itself may be an electronic component having a predetermined function.

The package board 110 has an upper surface 111, a bottom surface 112 which is parallel to the upper surface 111 and positioned on a side opposite to the upper surface 111, and a plurality of side surfaces 113 which are perpendicular to the upper and bottom surfaces 111 and 112 and connect the upper and bottom surfaces 111 and 112. A plurality of electronic components 121 and 122 are mounted on the upper surface 111 of the package board 110. The electronic components 121 and 122 are electrically and mechanically connected to the package board 110 through a conductive member such as a solder 130. The electronic components 121 and 122 are not particularly limited in type and may be an active component such as an IC chip or a passive component such as a capacitor, an inductor, a resistor, or a filter circuit including them.

A plurality of terminal electrodes 140 are provided on the bottom surface 112 of the package board 110. The terminal electrodes 140 each serve as an external terminal of the electronic circuit package 100. The terminal electrodes 140 are connected to the electronic components 121 and 122 mounted on the upper surface 111 through a wiring pattern 118 and a via conductor 119 incorporated in the package board 110.

In the electronic circuit package 100 according to the present embodiment, the upper surface 111 of the package board 110 is covered with the protective layer 210, and the side surface 113 of the package board 110 is covered with a protective layer 220 different from the protective layer 210. The electronic components 121 and 122 are embedded in the protective layer 210 without contacting the protective layer 220. The interface between the protective layers 210 and 220 does not contact the electronic components 121 and 122. The interface may partly reach the upper surface 111 of the package board 110.

The material of the protective layer 210 may be a common mold compound such as an epoxy-based resin material. The protective layer 210 may contain filler. The thickness of the protective layer 210 is 0.20 mm to 0.95 mm, for example.

The material of the protective layer 220 may be a thermosetting resin mixture having high heat resistance. The protective layer 220 may contain filler. The protective layer 220 may be formed of a material lower in hardness than the material of the protective layer 210. Specifically, for example, the material of the protective layer 220 may be an epoxy-based liquid resin equivalent to or softer than the material of the protective layer 210 or a silicon-based resin material softer than the material of the protective layer 210. The protective layer 220 may be lower in adhesion to the package board 110 than the protective layer 210.

As described above, in the electronic circuit package 100 according to the present embodiment, not a single protective layer but two different protective layers 210 and 220 are used, so that when stress due to a reflow process is applied, the interface between the protective layers 210 and 220 or the interface between the side surface 113 of the package board 110 and the protective layer 220 is preferentially peeled. Such peeling releases stress accumulated in the electronic circuit package 100, making stress less likely to be applied between the electronic components 121, 122 and the package board 110, with the result that breakage of the electronic components 121 and 122 and connection failure between the electronic components 121, 122 and the package board 110 hardly occur.

FIGS. 2A to 2H are process views for explaining a manufacturing method for the electronic circuit package 100 according to the present embodiment.

Figures 2A, 2B:
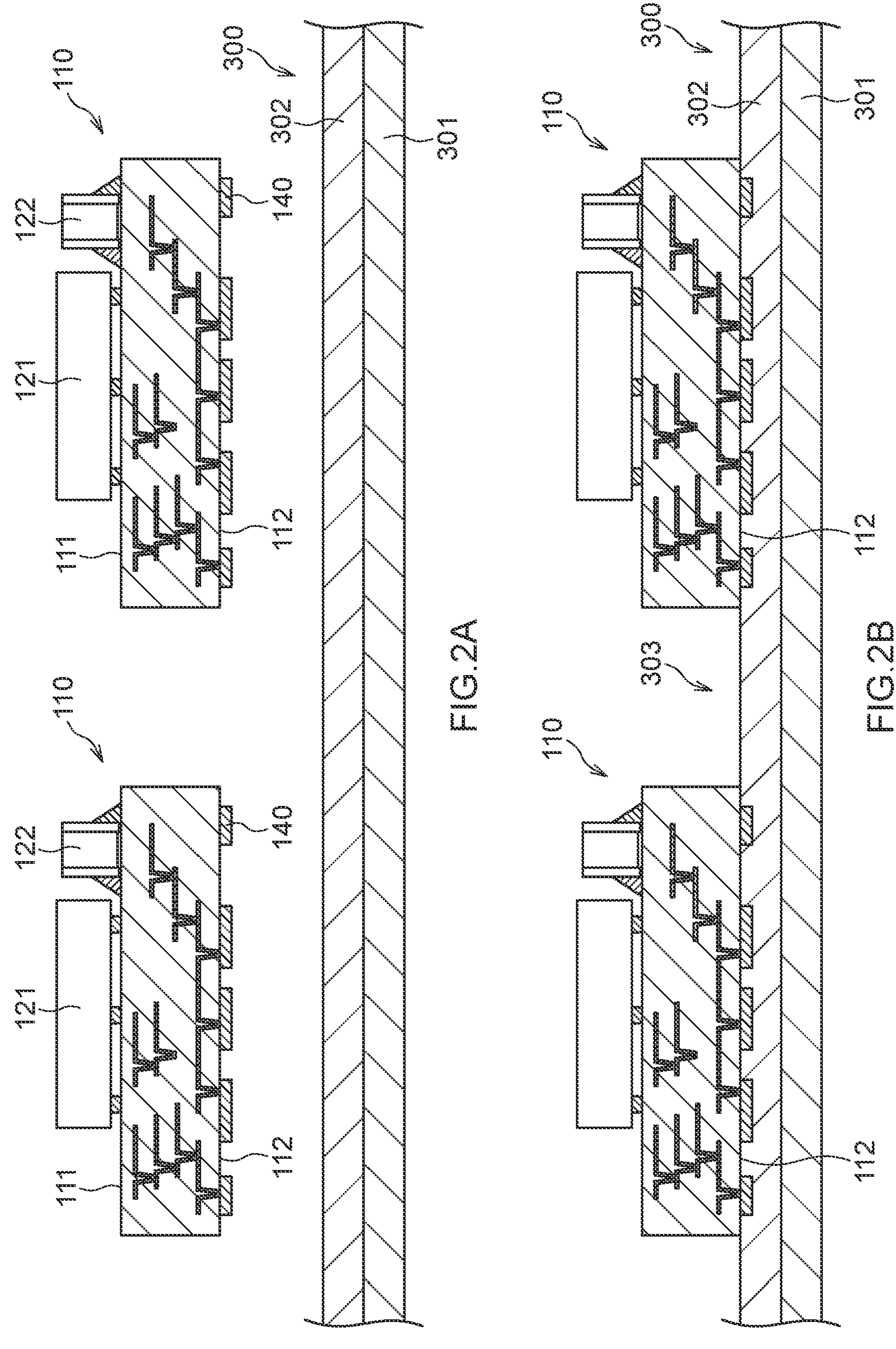
FIGS. 2A to 2H are process views for explaining a manufacturing method for the electronic circuit package.

First, as illustrated in FIG. 2A, there are prepared: the package boards 110 each having the electronic components 121 and 122 on the upper surface 111 and terminal electrodes 140 on the bottom surface 112; and a base material 300 having a plate 301 and a double-sided adhesive tape 302 laminated thereon. The material of the plate 301 may be glass epoxy or BT resin and may have a thickness of 0.2 mm to 0.4 mm. The plate 301 is peeled off in the subsequent process and is thus preferably made of an easily deformable material for easy mechanical peeling. The double-sided adhesive tape 302 may be a common heat resistant tape and may have an adhesive strength of 0.5 N/20 mm to 5 N/20 mm. The thickness of an adhesive layer included in the double-sided adhesive tape 302 may be 15 μm or more. This is because excessively small thickness of the adhesive layer causes insufficient adhesive strength, which may cause peeling of the package board 110 from the double-sided adhesive tape 302 during formation of the protective layer 210 to be described later. However, on the other hand, excessively large thickness of the adhesive layer makes peeling difficult. Thus, the adhesive strength of the double-sided adhesive tape 302 is preferably set to a range allowing easy peeling.

Then, as illustrated in FIG. 2B, the package boards 110 are placed on the surface of the base material 300 such that the bottom surface 112 is stuck to the double-sided adhesive tape 302. At this time, a predetermined gap 303 is formed between the adjacent package boards 110. The width of the gap 303 may be set to 650 μm, for example.

Figures 2C, 2D:
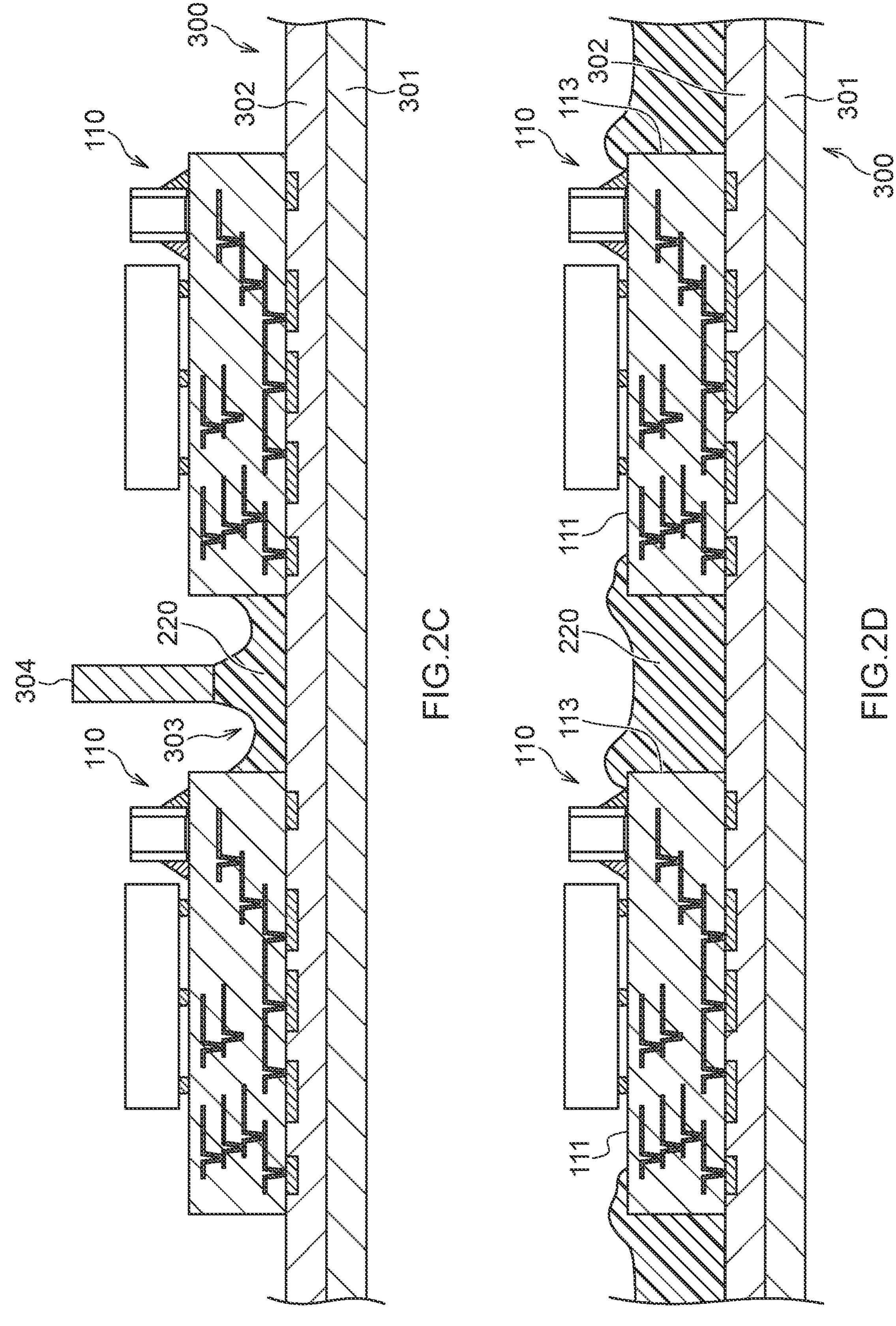

Then, as illustrated in FIG. 2C, the protective layer 220 is supplied to the gap 303 existing between the adjacent package boards 110. The protective layer 220 can be supplied by using a common dispenser 304. In this case, the width of the gap 303 is preferably set to a value allowing application of the protective layer 220 using a common needle. As the protective layer 220, a liquid-type material applicable using the dispenser 304 can be used. Further, the material of the protective layer 220 is preferably one whose viscosity can be adjusted by heating. Thus, as illustrated in FIG. 2D, the side surface 113 of the package board 110 is covered with the protective layer 220. In this state, the protective layer 220 may cover a part of the upper surface 111 of the package board 110. Even in this case, the protective layer 220 preferably does not contact the electronic components 121 and 122. After that, the protective layer 220 is dried and cured.

Figures 2E, 2F:
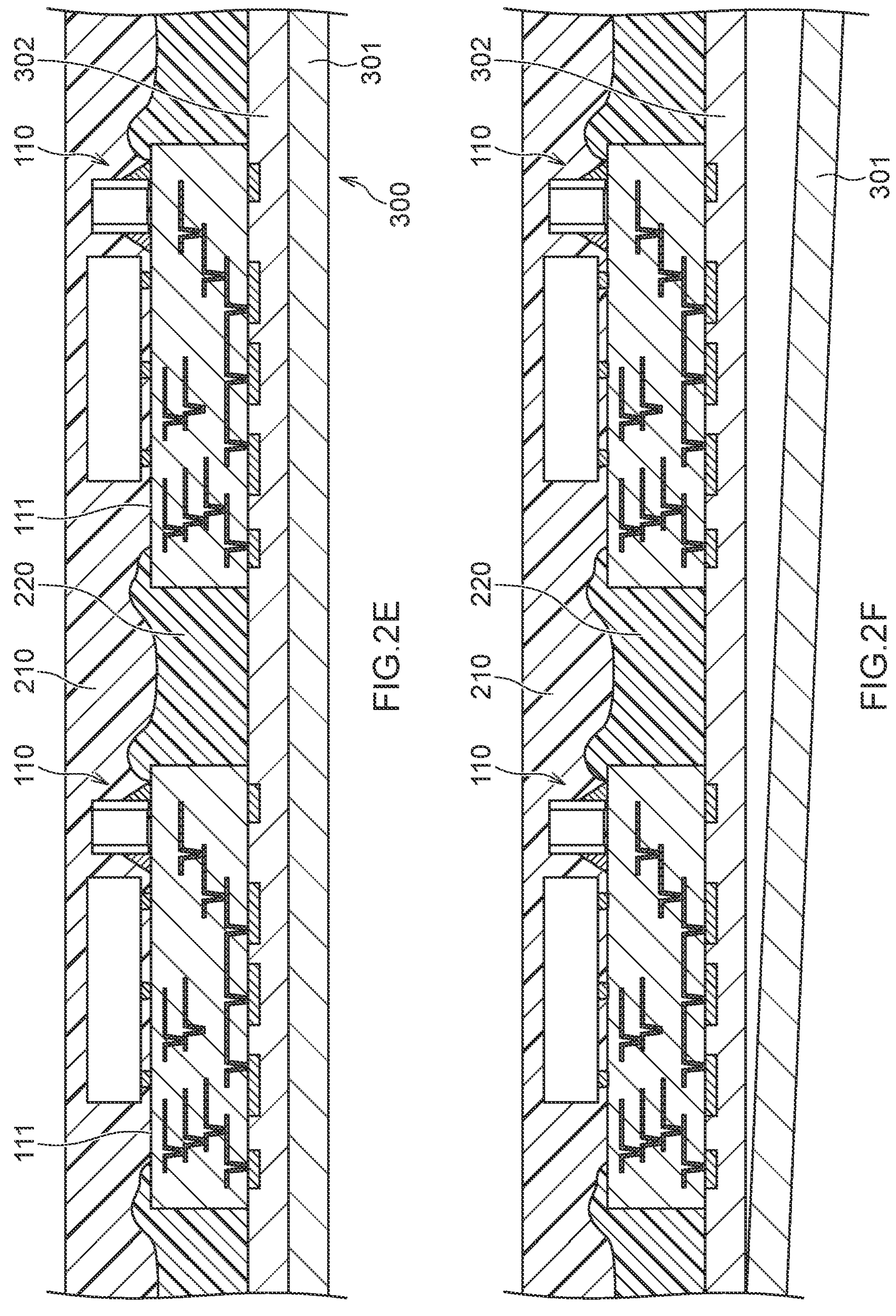

Then, as illustrated in FIG. 2E, the protective layer 210 is supplied to the entire surface of the structure illustrated in FIG. 2D. As a result, the protective layer 210 is formed on the upper surface 111 of the package board 110 to embed therein the electronic components 121 and 122. The protective layer 210 may be formed using known methods such as dispensing, printing, transfer molding, and compression molding.

Figures 2G, 2H:
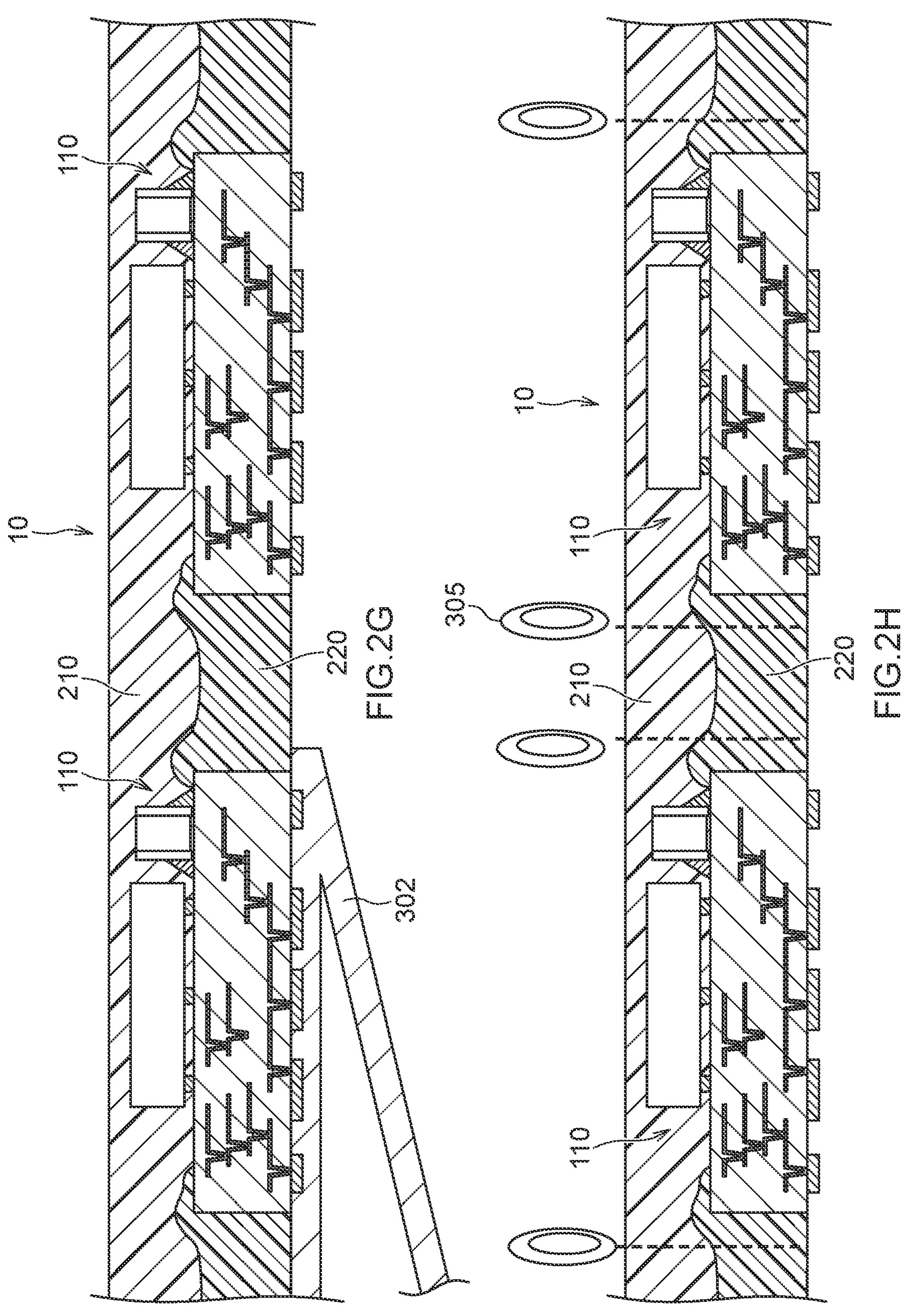

Then, after the plate 301 is mechanically peeled off as illustrated in FIG. 2F, the double-sided adhesive tape 302 is mechanically peeled off as illustrated in FIG. 2G. As a result, there is formed a plate member 10 having a structure in which the package boards 110 are embedded in the protective layers 210 and 220. Then, as illustrated in FIG. 2H, a blade dicer 305 or the like is used to cut the plate member 10 to singulate the electronic circuit packages 100. The cutting is made at a position at which the protective layers 210 and 220 are stacked. A blade of the blade dicer 305 may be a diamond electroformed material. In this way, the electronic circuit package 100 according to the present embodiment is completed.

Figure 3:
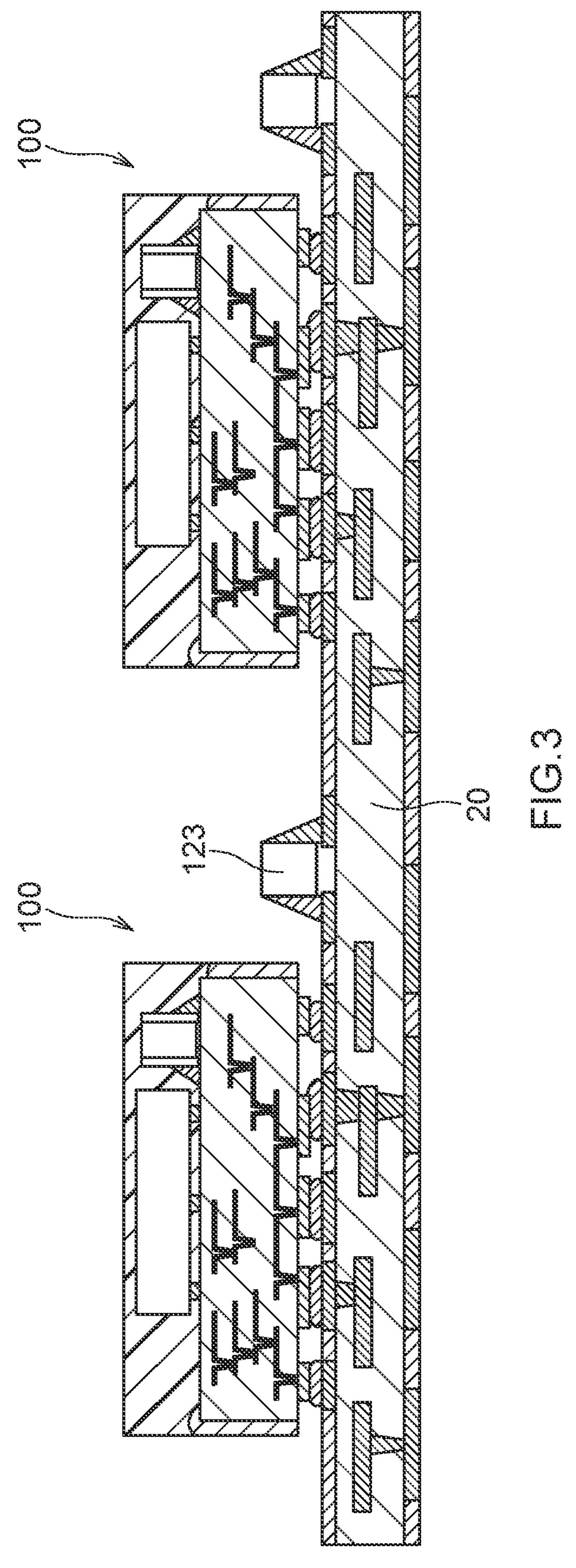
FIG. 3 is a view illustrating a state where the electronic circuit package is mounted on a circuit board.

The thus obtained electronic circuit package 100 can be used by being mounted on a circuit board 20 such as a motherboard, as illustrated in FIG. 3. The circuit board 20 may have another electronic component 123 mounted thereon. A reflow process is performed when the electronic circuit package 100 is mounted on the circuit board 20. In the electronic circuit package 100, the protective layers 210 and 220 are larger in linear expansion coefficient than the package board 110, so that there occurs bending stress so as to allow the upper surface 111 of the package board 110 to become convex at during reflow. Further, during cooling after the reflow process, the circuit board 20 contracts more than the electronic circuit package 100, so that, also in this case, bending stress occurs allowing the upper surface 111 of the package board 110 to become convex. Such stress causes peeling or cracks, which have not been apparent during manufacturing of the electronic circuit package 100, to progress at the time of reflow, which may result in product failure. However, in the electronic circuit package 100 according to the present embodiment, the package board 110 is covered with the two protective layers 210 and 220, so that the interface between the protective layers 210 and 220 or the interface between the side surface 113 of the package board 110 and the protective layer 220 is preferentially peeled off, thereby releasing stress in the electronic circuit package 100. This makes it less likely for the electronic circuit package 100 to have a failure even after being mounted on the circuit board 20 such as a motherboard.

Figure 4A:
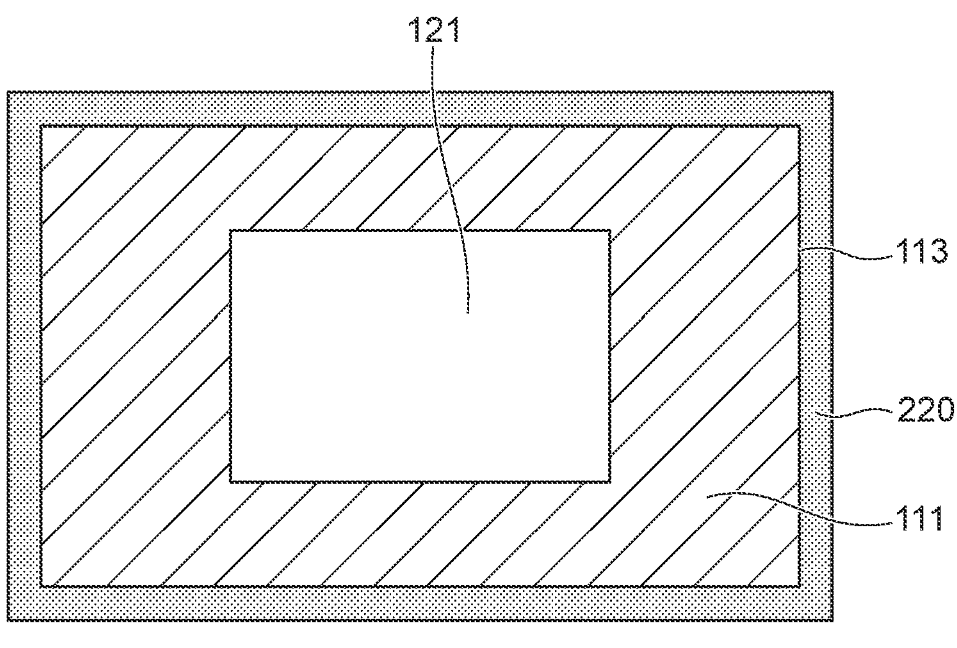
FIGS. 4A and 4B are respectively a schematic plan view and a schematic cross-sectional view for explaining a first example of a range in which a protective layer covers a package board.
Figure 4B:
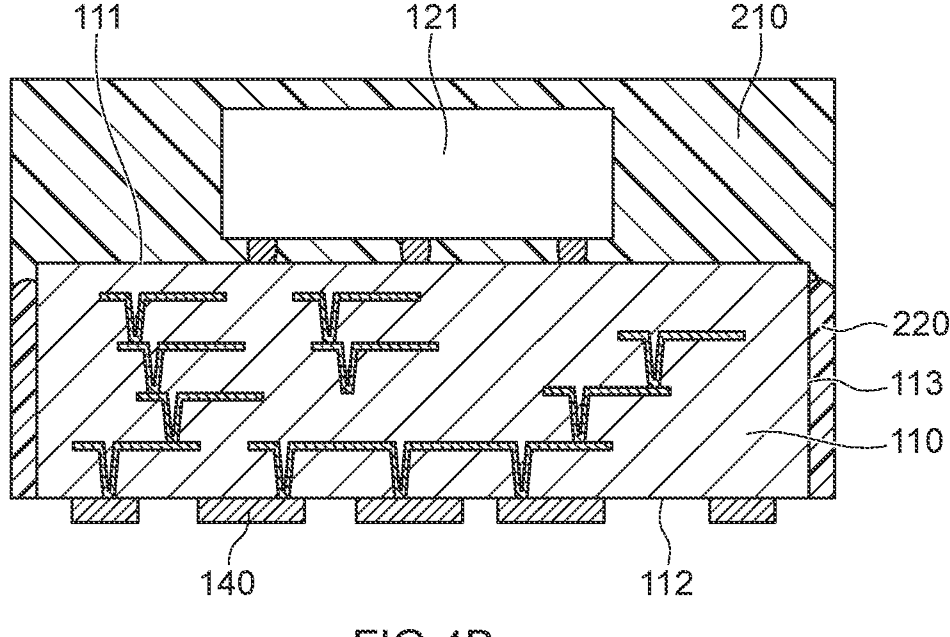
Figure 5A:
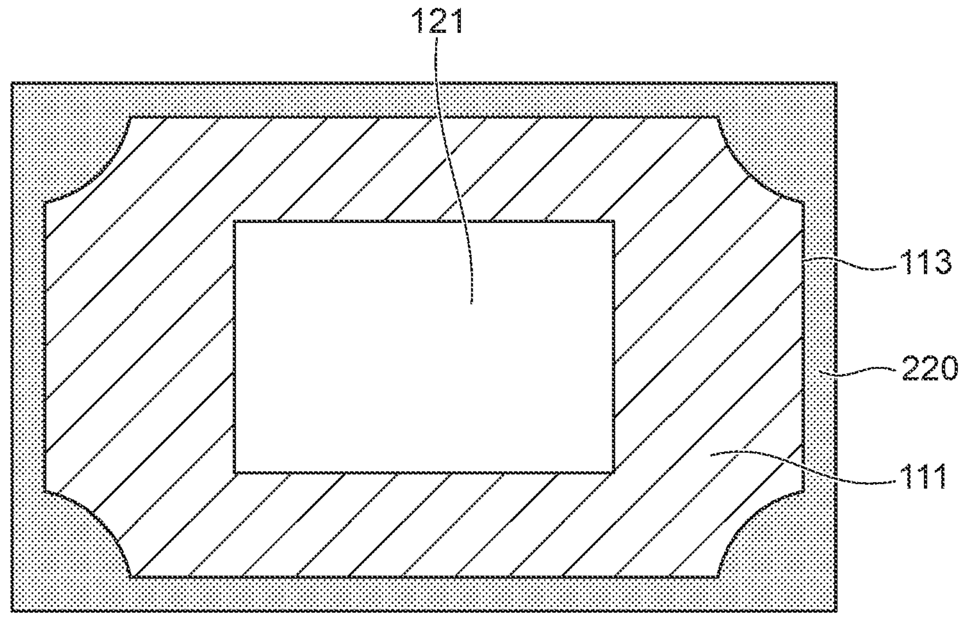
FIGS. 5A and 5B are respectively a schematic plan view and a schematic cross-sectional view for explaining a second example of a range in which the protective layer covers the package board.
Figure 5B:
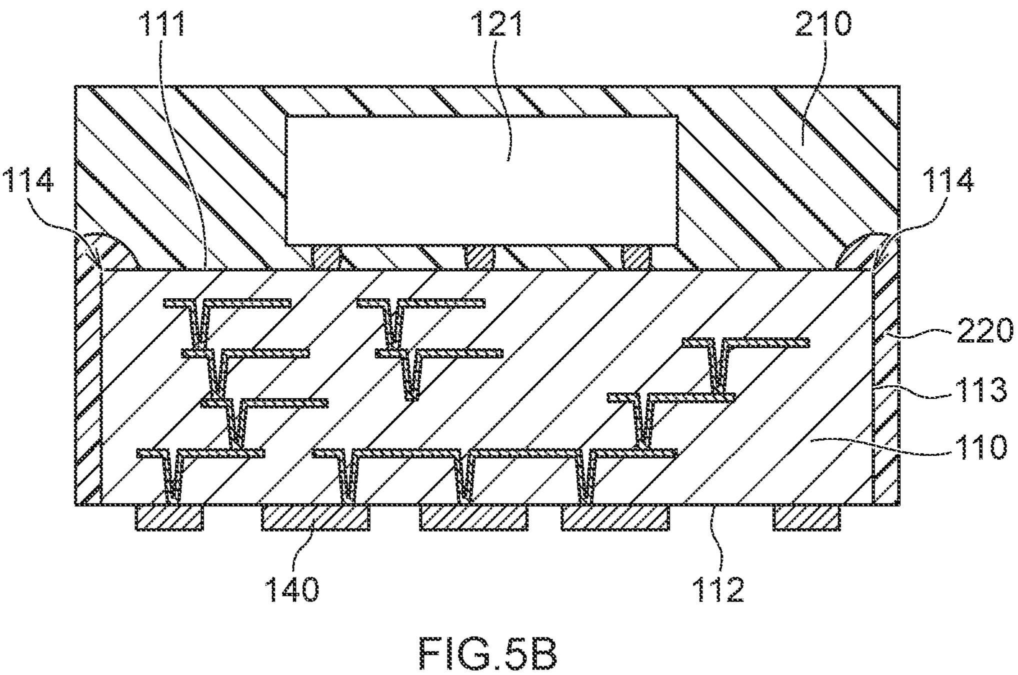

The range that the protective layer 220 covers the package board 110 is not particularly limited. For example, as illustrated in FIG. 4A, the protective layer 220 may only cover the side surface 113 of the package board 110. In this case, as illustrated in FIG. 4B which is a cross-sectional view, the upper surface 111 and a part of the side surface 113 of the package board 110 are covered with the protective layer 210. Further, as illustrated in FIG. 5A, the protective layer 220 may cover the side surface 113 and a part of the upper surface 111 of the package board 110. In the example illustrated in FIG. 5A, the corners of the upper surface 111 of the package board 110 are covered with the protective layer 220; however, the positions of the upper surface 111 that are covered with the protective layer 220 are not limited to this. In this case, as illustrated in FIG. 5B which is a cross-sectional view, an edge 114 positioned at the interface between the upper surface 111 and side surface 113 of the package board 110 is partly covered with the protective layer 220. The remaining part of each of the edges 114 is covered with the protective layer 210. In the example illustrated in FIGS. 5A and 5B, less than half of the entire edge 114 is covered with the protective layer 220.

Figure 6:
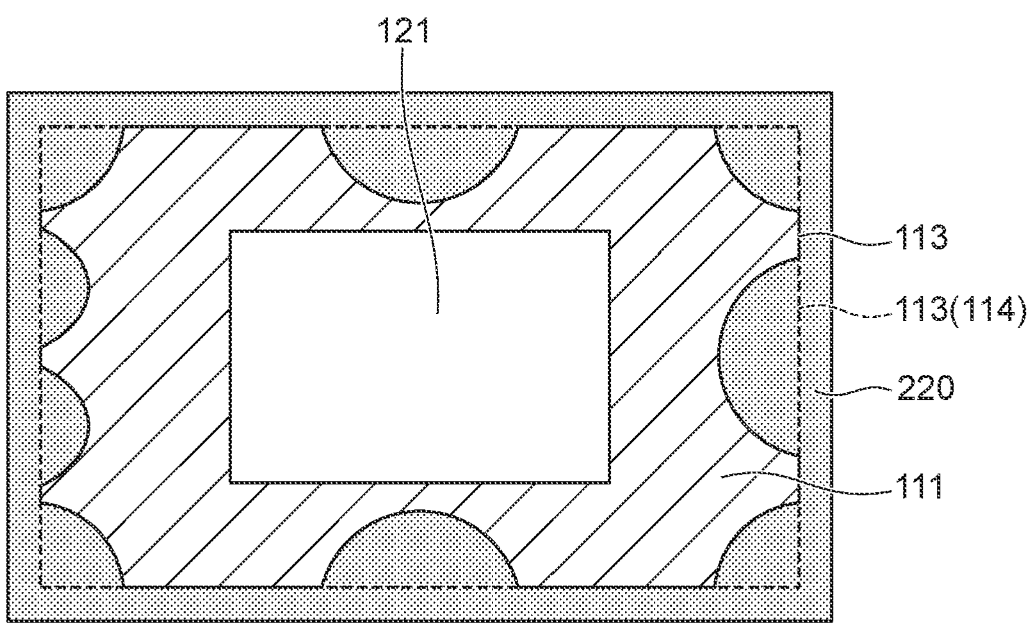
FIG. 6 is a schematic plan view for explaining a third example of a range in which the protective layer covers the package board.
Figure 7:
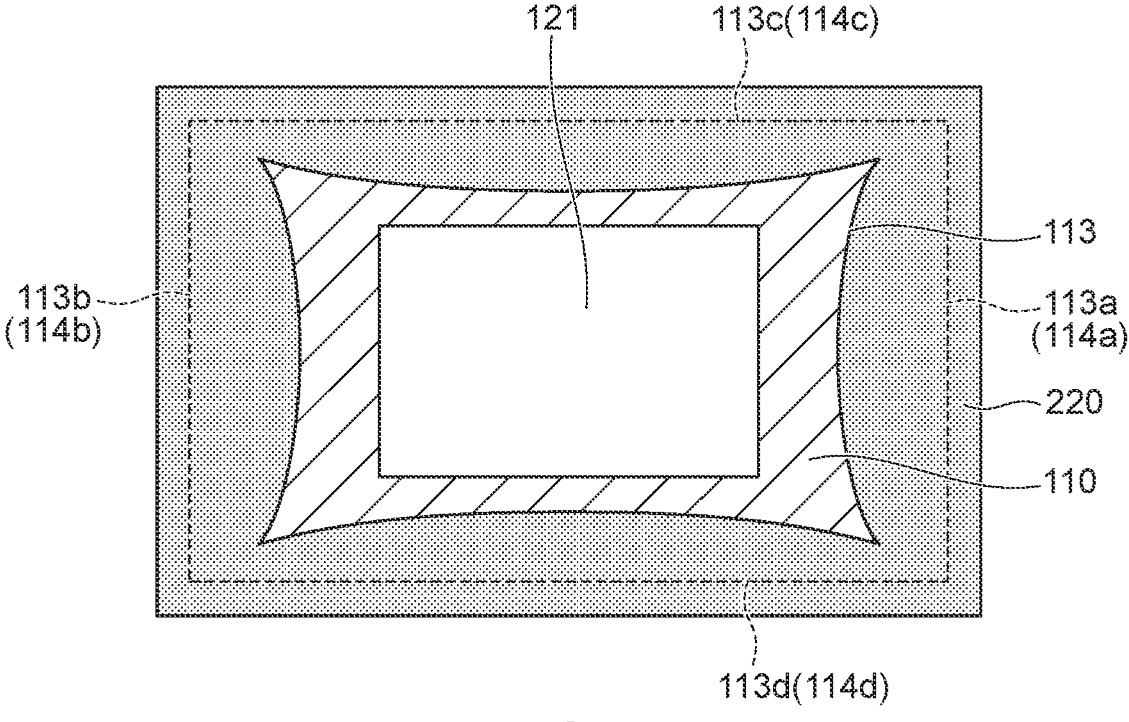
FIG. 7 is a schematic plan view for explaining a fourth example of a range in which the protective layer covers the package board.

Further, as illustrated in FIG. 6, the protective layer 220 may be applied to a part of the upper surface 111 of the package board 110 so as to cover more area of the edge 114. In the example illustrated in FIG. 6, equal to or more than half of the entire edge 114 is covered with the protective layer 220. Further, as illustrated in FIG. 7, the protective layer 220 may be applied to a part of the upper surface 111 of the package board 110 so as to cover the entire periphery of the edge 114. More specifically, when the side surface 113 of the package board 110 includes side surfaces 113*a* and 113*b* opposite to each other and side surfaces 113*c* and 113*d* which are perpendicular to the side surfaces 113*a* and 113*b* and opposite to each other, there are formed, in the package board 110, four edges 114*a* to 114*d* positioned respectively at the boundaries between the upper surface 111 and the side surfaces 113*a* to 113*d*. In the example illustrated in FIG. 7, the protective layer 220 covers a part of the upper surface 111 of the package board 110 beyond the edges 114*a* to 114*d*.

As described above, when a part of the upper surface 111 of the package board 110 is covered with the protective layer 220, a part of the interface between the protective layers 210 and 220 is positioned at the upper surface 111 of the package board 110. In this case, stress accumulated on the upper surface of the package board 110 is released by peeling of the interface between the protective layers 210 and 220, making strong stress less likely to be applied to the connection part between the package board 110 and the electronic components 121 and 122. As a result, connection failure between the electronic components 121, 122 and the package board 110 hardly occurs.

Further, the protective layer 220 need not cover the entire surface of the side surface 113 of the package board 110. For example, as illustrated in FIG. 8A, a configuration may be employed, in which an upper area A of the side surface 113 that is positioned on the upper surface 111 side is covered with the protective layer 210, and a lower area B of the side surface 113 that is positioned on the bottom surface 112 side is covered with the protective layer 220. Alternatively, the side surface 113 of the package board 110 may be covered substantially entirely with the protective layer 220 as illustrated in FIG. 8B, and the height position of the upper end of the protective layer 220 may be higher than the height position of the upper surface 111 of the package board 110, as illustrated in FIG. 8C.

Figure 9A:
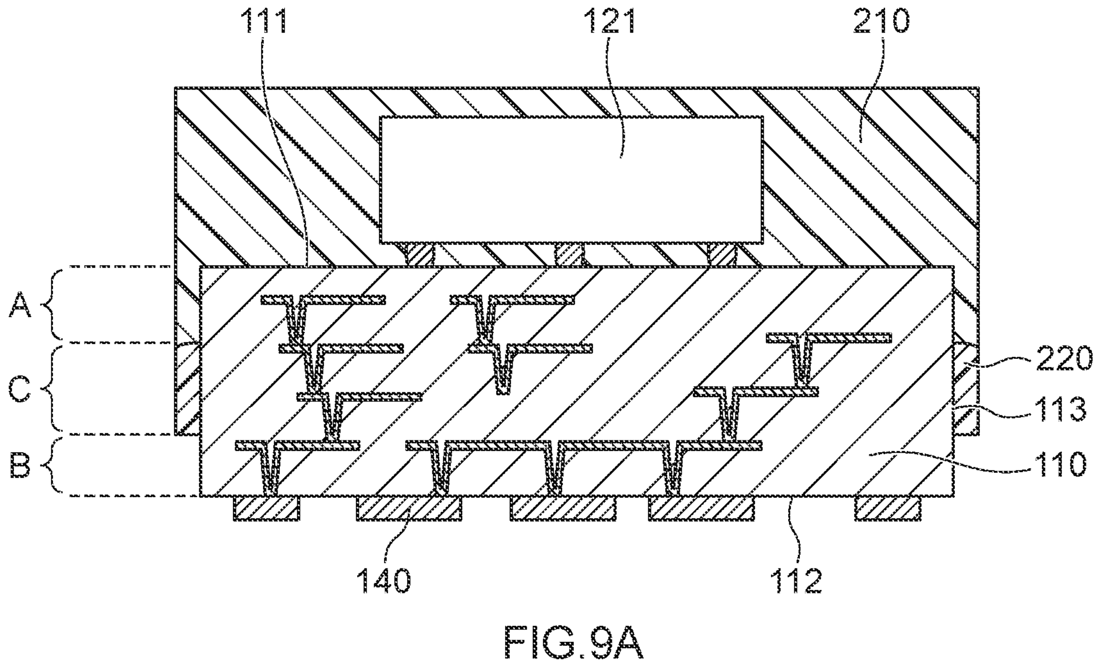
FIGS. 9A and 9B are respectively a schematic cross-sectional view and a schematic side view each explaining the height position of the lower end of the protective layer.
Figure 9B:
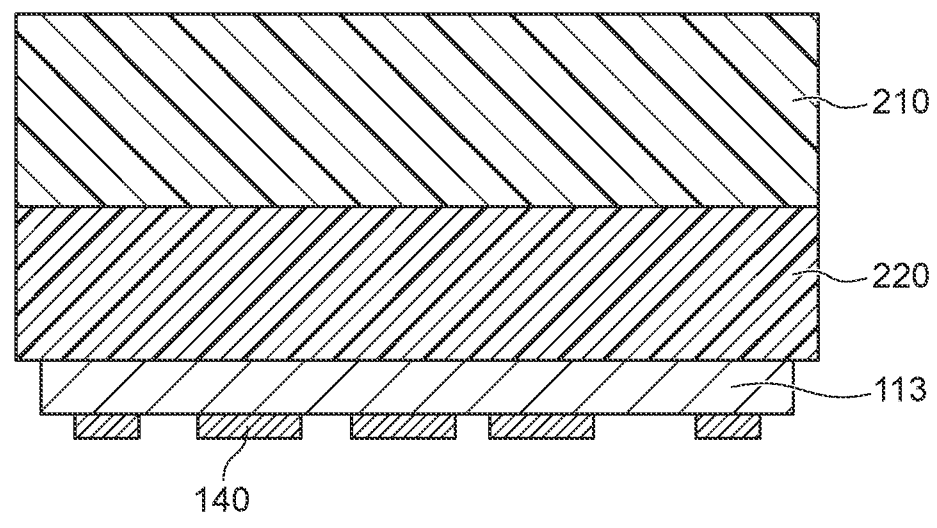

Further, as illustrated in FIGS. 9A and 9B (cross-sectional and side views), a configuration may be employed, in which an upper area A of the side surface 113 positioned on the upper surface 111 side is covered with the protective layer 210, a lower area B of the side surface 113 positioned on the bottom surface 112 side is exposed, and a center area C positioned between the upper and lower areas A and B is covered with the protective layer 220. That is, the side surface 113 of the package board 110 may have a part that is covered with neither the protective layer 210 nor protective layer 220. In this case, the area of a part of the side surface 113 of the package board 110 that is covered with neither the protective layer 210 nor protective layer 220 is preferably 40% or less of the entire area of the side surface 113.

Figure 10A:
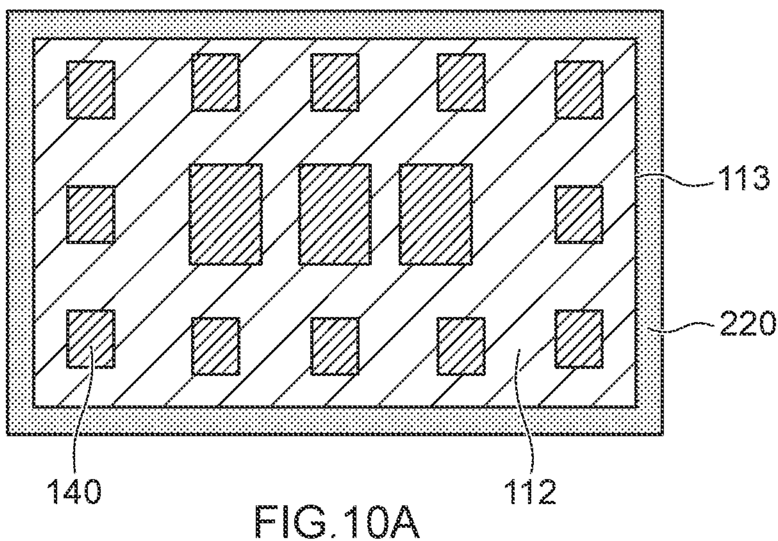
FIGS. 10A to 10C are respectively a schematic bottom view, a schematic cross-sectional view, and a schematic side view each explaining a first example of a state of the bottom surface of the package board.
Figure 10B:
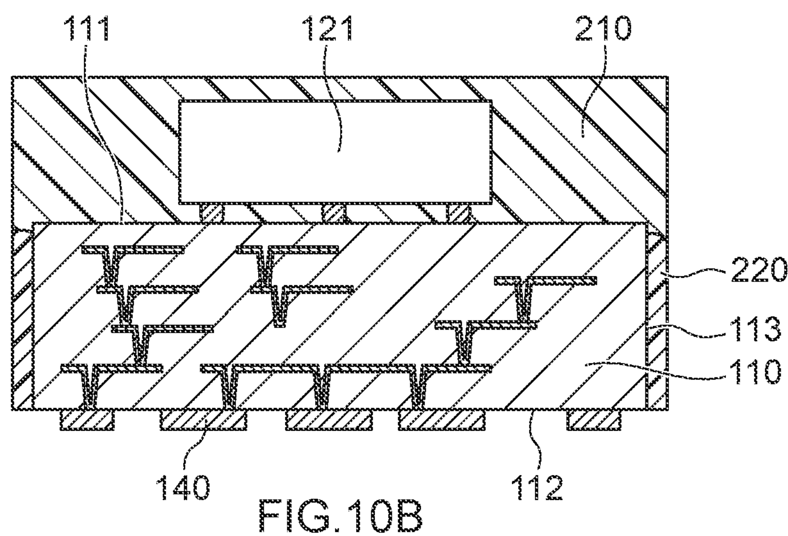
Figure 10C:
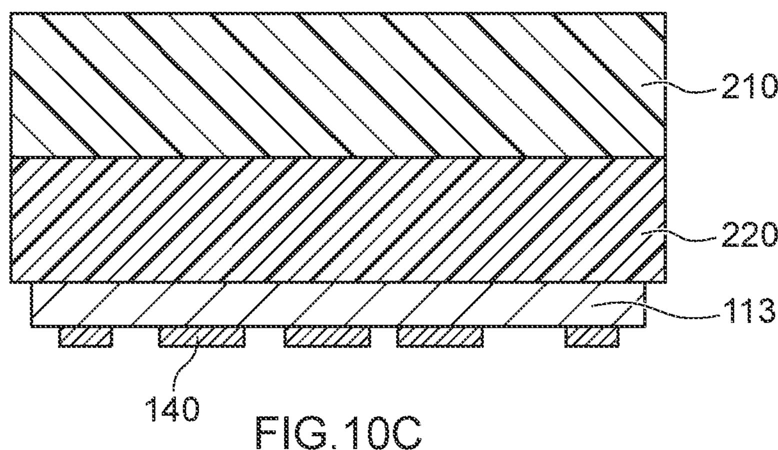
Figure 11A:
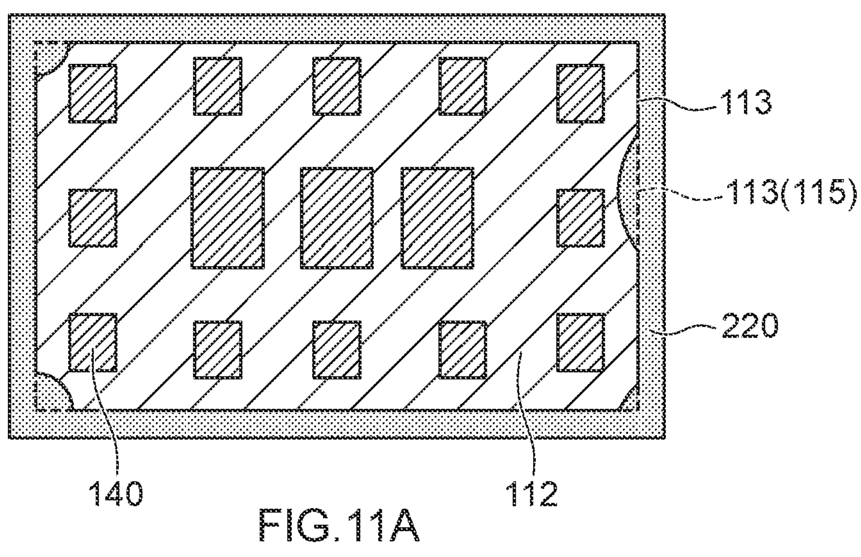
FIGS. 11A to 11C are respectively a schematic bottom view, a schematic cross-sectional view, and a schematic side view each explaining a second example of a state of the bottom surface of the package board.
Figure 11B:
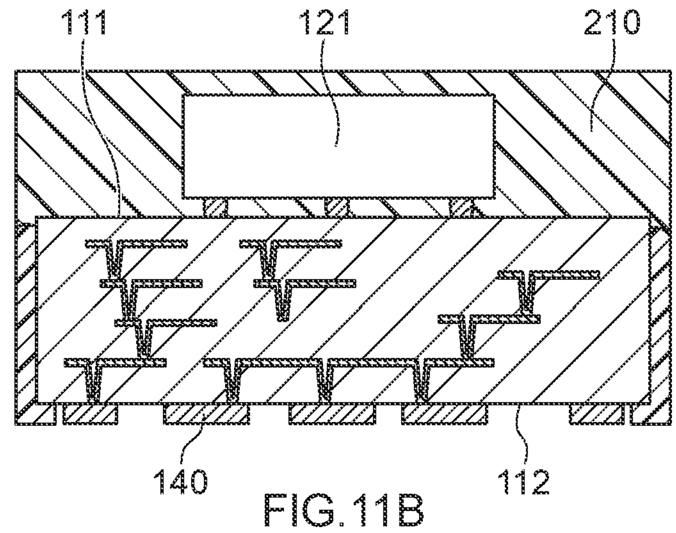
Figure 11C:
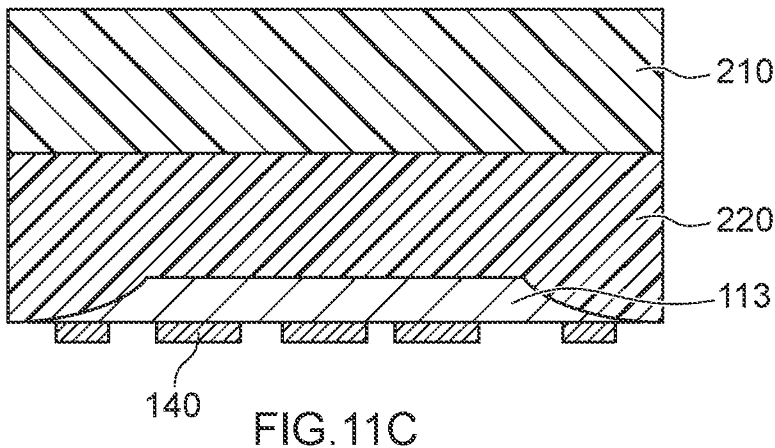

As illustrated in FIGS. 10A to 10C, the bottom surface 112 of the package board 110 need not be covered with the protective layer 220. Alternatively, as illustrated in FIGS. 11A to 11C, the protective layer 220 may cover the side surface 113 of the package board 110 and a part of the bottom surface 112. In this case, as illustrated in FIG. 11A which is a plan view, an edge 115 positioned at the boundary between the bottom surface 112 and side surface 113 of the package board 110 is partly covered with the protective layer 220. The remaining part of the edge 115 is not covered with the protective layer 220.

Figures 12A, 12B, 12C:
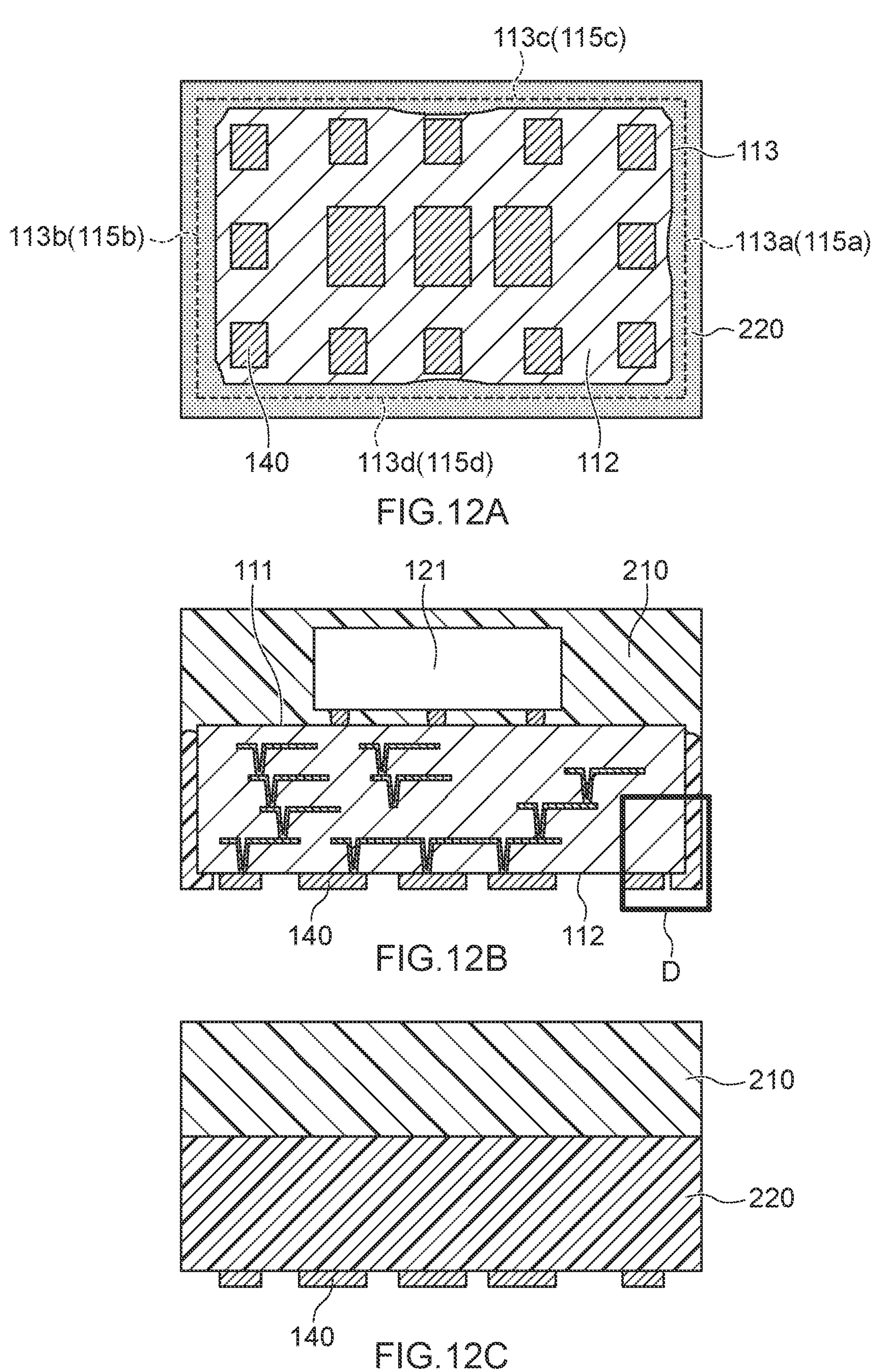
FIGS. 12A to 12C are respectively a schematic bottom view, a schematic cross-sectional view, and a schematic side view each explaining a third example of a state of the bottom surface of the package board.

Further, as illustrated in FIGS. 12A to 12C, the protective layer 220 may be applied to a part of the bottom surface 112 of the package board 110 so as to cover the entire periphery of the edge 115. More specifically, when the side surface 113 of the package board 110 includes side surfaces 113*a* and 113*b* opposite to each other and the side surfaces 113*c* and 113*d* which are perpendicular to the side surfaces 113*a* and 113*b* and opposite to each other, there are formed, in the package board 110, four edges 115*a* to 115*d* positioned respectively at the boundaries between the bottom surface 112 and the side surfaces 113*a* to 113*d*. In the example illustrated in FIG. 12A, the protective layer 220 covers a part of the bottom surface 112 of the package board 110 beyond the edges 115*a* to 115*d*. Even in this case, the terminal electrodes 140 are not covered with the protective layer 220.

Figure 13A:
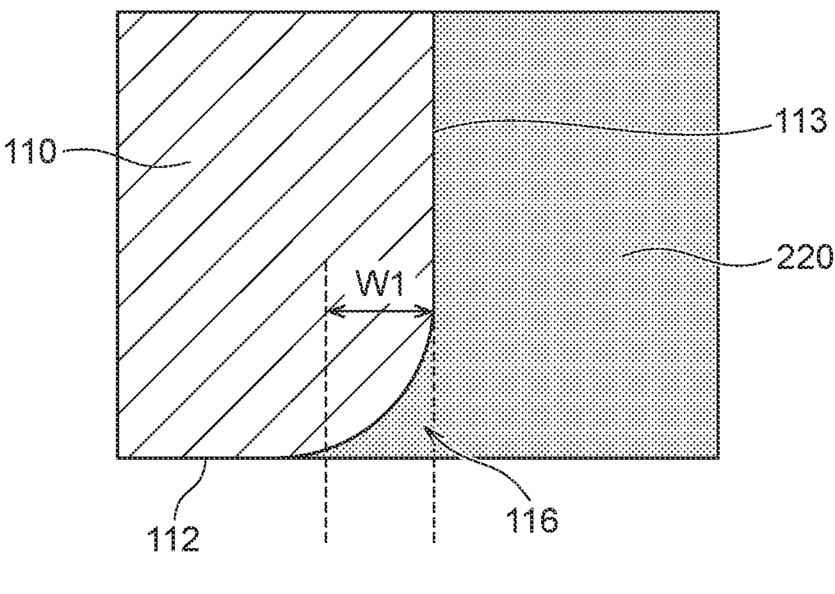
FIGS. 13A and 13B are each a schematic enlarged view of an area D illustrated in FIG. 12B.
Figure 13B:
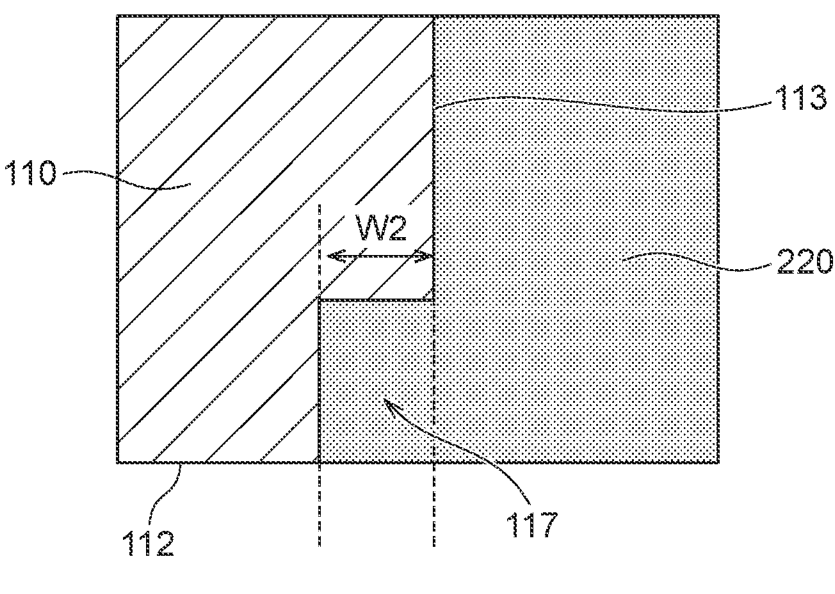

FIGS. 13A and 13B are schematic enlarged views of the area D illustrated in FIG. 12B. In the example illustrated in FIG. 13A, the edge positioned at the boundary between the bottom surface 112 and side surface 113 of the package board 110 forms a round shape part 116. In this case, the round shape part 116 may be embedded in the protective layer 220. The bottom surface 112 of the package board 110 and the protective layer 220 overlap each other with a width of W1 in a plan view. In the example illustrated in FIG. 13B, the edge positioned at the boundary between the bottom surface 112 and side surface 113 of the package board 110 forms a cut part 117. In this case, the cut part 117 may be embedded in the protective layer 220. The bottom surface 112 of the package board 110 and the protective layer 220 overlap each other with a width of W2 in a plan view.

While a preferred embodiment of the present invention has been described, the present invention is not limited to the above embodiment, and various modifications may be made within the scope of the present invention, and all such modifications are included in the present invention.

EXAMPLES

Samples of electronic circuit packages were produced to evaluate effects of the protective layer 220. As shown in the table of FIG. 14, nine types of samples A1, A2, A3, A4, A5, A6, B, C, and D were produced (20 samples were prepared for each type). In samples A1 to A6, the protective layer 220 was formed of epoxy-based liquid resin (Vickers hardness after curing: 50 Hv to 110 Hv). In sample B, the protective layer 220 was formed of epoxy-based liquid resin (Vickers hardness after curing: 30 Hv to 90 Hv) softer than the epoxy-based liquid resin used for samples A1 to A6. In sample C, the protective layer 220 was formed of silicon-based liquid resin (Vickers hardness after curing: 10 Hv to 40 Hv) softer than the epoxy-based liquid resin used for sample B. In sample D, the protective layer 220 was not used, and the upper and side surfaces 111 and 113 of the package board 110 were entirely covered with the protective layer 210. The Vickers hardness was measured using HM-114 manufactured by Mitutoyo Corporation with test force and holding time set to 0.98 N (HV01) and 5 sec, respectively.

In samples A1 and A2, the protective layer 220 covers only the side surface 113 of the package board 110 and did not cover the upper surface 111 as illustrated in FIGS. 4A and 4B. The volume of the protective layer 220 in sample A2 is middle level, and the volume of the protective layer 220 in sample A1 is smaller than that in sample A2. In samples A3 and A4, the protective layer 220 covers a part of the upper surface 111 of the package board 110, and less than half of the entire edge 114 is covered with the protective layer 220 as illustrated in FIGS. 5A and 5B. The volume of the protective layer 220 in sample A3 is middle level (equivalent to that in sample A2), and the volume of the protective layer 220 in sample A4 is larger than that in sample A3. In sample A5, a large volume of the protective layer 220 covers a part of the upper surface 111 of the package board 110, and equal to or more than half of the entire edge 114 is covered with the protective layer 220 as illustrated in FIG. 6. The volume of the protective layer 220 in sample A5 is middle level (equivalent to that in sample A2). In sample A6, an even larger volume of the protective layer 220 is applied to a part of the upper surface 111 of the package board 110 so as to cover the entire periphery of the edge 114 as illustrated in FIG. 7. The volume of the protective layer 220 is larger than that in sample A3. Samples B and C differ from sample A3 only in the material of the protective layer 220.

Then, samples were subjected to moisture absorption reflow test conforming to J-STD-022E (standard for moisture absorption reflow) specified in JEDEC. As the test condition, it was assumed that storage rank was MSL2a. The samples before the moisture absorption reflow test (immediately after production) and after the moisture absorption reflow test were subjected to nondestructive inspection, and the presence/absence of a structural defect was determined. Specifically, the samples were subjected to ultrasonic imaging, and when an image determined to be peeling or cracks had been detected with a percentage of 5% or more relative to the entire area to be analyzed, the corresponding sample was determined as defective. As an ultrasonic microscope, FineSAT V manufactured by Hitachi High-Tech Corporation was used, in which the probe frequency was set to 50 MHz. The image of each sample was evaluated by a reflection method. A sample determined as defective in the nondestructive inspection before the moisture absorption reflow test (immediately after production) was discarded, and only a sample determined as acceptable was subjected to the moisture absorption reflow test. The sample after the moisture absorption reflow test was also subjected to characteristic inspection, in which a probe was made to contact a user terminal surface to determine the presence/absence of a defective characteristic. Then, a sample whose characteristics fell outside a design tolerance was determined as defective.

Evaluation results are shown in the table of FIG. 14. As shown in FIG. 14, as for sample D having no protective layer 220, out of 20 samples, three samples were found to be defective in the nondestructive inspection before the moisture absorption reflow test, five samples were found to be defective in the nondestructive inspection after the moisture absorption reflow test, and two samples were found to be defective in the characteristic inspection. On the other hand, as for samples A1 to A6, sample B, and sample C, no defective product was found in the characteristic inspection. In particular, as for samples A3 to A5, no defective product was found even in the nondestructive inspection.

What is claimed is:

1. An electronic circuit package comprising:

a package board having an upper surface, a bottom surface positioned on a side opposite to the upper surface, and a side surface connecting the upper and bottom surfaces;

an electronic component mounted on the upper surface of the package board;

a first protective layer covering the upper surface of the package board so as to embed therein the electronic component; and a second protective layer covering the side surface of the package board, wherein the first and second protective layers contacting each other, wherein the second protective layer is made of a different material from the first protective layer, wherein the second protective layer is lower in hardness than the first protective layer, and wherein the first and second protective layers are made of an epoxy-based resin material.

2. The electronic circuit package as claimed in claim 1, wherein the first protective layer further covers a part of the side surface of the package board.

3. The electronic circuit package as claimed in claim 1, wherein the side surface of the package board includes an upper area positioned on an upper surface side and a lower area positioned on a bottom surface side, and wherein a part of the lower area is exposed without being covered with the second protective layer.

4. An electronic circuit package comprising:

a package board having an upper surface, a bottom surface positioned on a side opposite to the upper surface, and a side surface connecting the upper and bottom surfaces;

an electronic component mounted on the upper surface of the package board;

a first protective layer covering the upper surface of the package board so as to embed therein the electronic component; and a second protective layer covering the side surface of the package board, wherein the first and second protective layers contacting each other, wherein the second protective layer further covers a part of the upper surface of the package board without covering the electronic component, wherein the package board has an edge positioned at a boundary between the upper and side surfaces, and wherein the edge has a first portion covered with the second protective layer and a second portion not covered with the second protective layer.

5. An electronic circuit package comprising:

a package board having an upper surface, a bottom surface positioned on a side opposite to the upper surface, and a side surface connecting the upper and bottom surfaces;

an electronic component mounted on the upper surface of the package board;

a first protective layer covering the upper surface of the package board so as to embed therein the electronic component; and a second protective layer covering the side surface of the package board, wherein the first and second protective layers contacting each other, wherein the second protective layer further covers a part of the upper surface of the package board without covering the electronic component, wherein the side surface of the package board includes first and second side surfaces opposite to each other and third and fourth side surfaces perpendicular to the first and second side surfaces and opposite to each other, wherein the package board has first to fourth edges positioned respectively at boundaries between the upper surface and the first to fourth side surfaces, and wherein the second protective layer further covers a part of the upper surface of the package board beyond the first to fourth edges.

6. An electronic circuit package comprising:

a package board having an upper surface, a bottom surface positioned on a side opposite to the upper surface, and a side surface connecting the upper and bottom surfaces;

a plurality of terminal electrodes provided on the bottom surface of the package board;

an electronic component mounted on the upper surface of the package board;

a first protective layer covering the upper surface of the package board so as to embed therein the electronic component; and a second protective layer covering the side surface of the package board, wherein the first and second protective layers contacting each other, wherein the second protective layer further covers a part of the bottom surface of the package board without covering the terminal electrodes, wherein the package board has an edge positioned at a boundary between the bottom surface and the side surface, and wherein the edge has a first portion covered with the second protective layer and a second portion not covered with the second protective layer.

7. An electronic circuit package comprising:

a package board having an upper surface, a bottom surface positioned on a side opposite to the upper surface, and a side surface connecting the upper and bottom surfaces;

a plurality of terminal electrodes provided on the bottom surface of the package board;

an electronic component mounted on the upper surface of the package board;

a first protective layer covering the upper surface of the package board so as to embed therein the electronic component; and a second protective layer covering the side surface of the package board, wherein the first and second protective layers contacting each other, wherein the second protective layer further covers a part of the bottom surface of the package board without covering the terminal electrodes, wherein the side surface of the package board includes first and second side surfaces opposite to each other and third and fourth side surfaces perpendicular to the first and second side surfaces and opposite to each other, wherein the package board has first to fourth edges positioned respectively at boundaries between the bottom surface and the first to fourth side surfaces, and wherein the second protective layer further covers a part of the bottom surface of the package board beyond the first to fourth edges.

* * * * *